(12) United States Patent
Dahms et al.

(10) Patent No.: US 8,114,263 B2
(45) Date of Patent: Feb. 14, 2012

(54) POLYVINYLAMMONIUM COMPOUND, METHOD OF MANUFACTURING SAME, ACIDIC SOLUTION CONTAINING SAID COMPOUND AND METHOD OF ELECTROLYTICALLY DEPOSITING A COPPER DEPOSIT

(75) Inventors: Wolfgang Dahms, Berlin (DE); Udo Grieser, Berlin (DE); Olanda Grieser, legal representative, Berlin (DE); Christopher Grieser, legal representative, Berlin (DE); Philip Hartmann, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 942 days.

(21) Appl. No.: 11/816,717

(22) PCT Filed: Mar. 1, 2006

(86) PCT No.: PCT/EP2006/002064
§ 371 (c)(1),
(2), (4) Date: Apr. 8, 2008

(87) PCT Pub. No.: WO2006/094755
PCT Pub. Date: Sep. 14, 2006

(65) Prior Publication Data
US 2008/0210569 A1 Sep. 4, 2008

(30) Foreign Application Priority Data

Mar. 11, 2005 (DE) .................. 10 2005 011 708

(51) Int. Cl.
*C25D 3/38* (2006.01)
(52) U.S. Cl. ........................................ 205/296; 205/291
(58) Field of Classification Search .................. 205/296, 205/291
See application file for complete search history.

(56) References Cited

U.S. PATENT DOCUMENTS

| | | | |
|---|---|---|---|
| 3,502,551 A | 3/1970 | Todt | |
| 3,770,598 A | 11/1973 | Creutz | |
| 4,110,176 A | 8/1978 | Creutz et al. | |
| 4,774,285 A | 9/1988 | Pfohl | |
| 5,232,575 A | 8/1993 | Dodd | |
| 5,445,727 A | 8/1995 | Schwendemann et al. | |
| 2005/0045488 A1 | 3/2005 | Paneccasio et al. | |

FOREIGN PATENT DOCUMENTS

| | | |
|---|---|---|
| DE | 933843 | 10/1955 |
| DE | 947656 | 8/1956 |
| DE | 1152863 | 8/1963 |
| DE | 1165962 | 3/1964 |
| DE | 1218247 | 6/1966 |
| DE | 1246347 | 8/1967 |
| DE | 1521062 | 8/1969 |
| DE | 1521031 | 9/1969 |
| DE | 2039831 | 1/1972 |
| DE | 2706521 | 9/1977 |
| DE | 2746938 | 4/1979 |
| DE | 19643091 | 4/1998 |
| DE | 19758121 | 7/1999 |
| DE | 10261852 | 6/2004 |
| EP | 0068807 | 1/1983 |
| EP | 0071050 | 2/1983 |
| EP | 0107109 | 5/1984 |
| EP | 0216387 | 4/1987 |
| JP | A-H07-32823 | 12/1995 |
| WO | 9315241 | 8/1993 |

OTHER PUBLICATIONS

Martel, Bernard et al: "N-Benzylated Poly(vinylamine): Synthesis, Charaterization, and Catalytic Activity in Ester Cleavage" Macromolecules, 27(19), 5258-62 CODEN: MAMOBX; ISSN: 0024-9297, 1994, XP002392558.
Chen, Xiaonong et al: "Surface activity and colloidal properties of hydrophobically modified polyvinylamine in aqueous solution" Polymer Preprints (American Chemical Society, Division of Polymer Chemistry) 45(2), 269-270 CODEN: ACPPAY; ISSN: 0032-3934, 2004, XP009070119.
Database CA ÄOnlineÜ Chemical Abstracts Service Service, Columbus, Ohio, US; Oct. 8, 2002, Kamiguchi, Keisuke et al: The interaction of poly(vinylamine)s modified with hydrophobic groups and hydrophobic low-molecular probes XP002392576 retrieved from STN Database accession No. 2002:760852 -& Kobunshi Ronbunshu, 59 (9), 555-561 CODEN: KBRBA3;ISSN:0386-2186, 2002, XP009070154.
Database CA OnlineÜ Chemical Abstracts Service Service, Columbus, Ohio, US; Nov. 6, 2004, Abe, Hideo et al: "The hardness retaining agent for copper electroplate, copper plating method, and gravure printing plate and die for lens making prepared by using the electroplating method" XP 002392577 retrieved from STN Database accession No. 2004:931759—& JP 2004 307991 A (Toppan Printing Co., Ltd., Japan) Nov. 4, 2004.
Chen, Xiaonong et al"pH-dependence of the Properties of Hydrophobically Modified Polyvinyllamine" Langmuir, 21(25), 11673-11677 CODEN: LANGD5;ISSN: 0743-7483, 2005, XP002392561.
Fikentscher, Cellulosechemie 13:(1932) 58-71.

*Primary Examiner* — Luan Van
(74) *Attorney, Agent, or Firm* — Paul and Paul

(57) ABSTRACT

The invention relates to a polyvinylammonium compound, to a method of manufacturing said compound, to an aqueous acidic solution containing at least said Polyvinylammonium compound for electrolytically depositing a copper deposit as well as to a method of electrolytically depositing a copper deposit using said aqueous acidic solution, said polyinylammonium compound corresponding to the general chemical formula (1): as well as to polyvinylammonium compounds of the general chemical formula (1), wherein one of the monomer units or both having indices I and m are present in the neutral form.

12 Claims, No Drawings

POLYVINYLAMMONIUM COMPOUND, METHOD OF MANUFACTURING SAME, ACIDIC SOLUTION CONTAINING SAID COMPOUND AND METHOD OF ELECTROLYTICALLY DEPOSITING A COPPER DEPOSIT

The invention relates to a polyvinylammonium compound and to a method of manufacturing same as well as to an acidic solution containing said compound for electrolytically depositing a copper deposit as well as to a method of electrolytically depositing a copper deposit using said solution containing said compound.

Various methods and deposition solutions are used to produce decorative bright and leveled surfaces, large surfaces for instance, on metals or plastic materials or to form ductile layers, for example in the production of semiconductors or printed circuit boards.

The term leveling is thereby understood to refer to the capability of a metal deposition solution, for example of a copper deposition solution, to smooth and, after a short plating time, to make invisible rough substrate surfaces that may also comprise brush and grinding scratches so that a mark-free, mirror-like surface is obtained.

For deposition of bright copper surfaces, small quantities of organic additives may be added to the mostly acidic copper electrolytes in order to obtain bright copper layers instead of a crystalline matt deposit.

Compounds or a mixture of a plurality of compounds, such as polyethylene glycols, thiourea and the derivatives thereof such as thiohydantoin, thiocarbamic acid esters as well as thiophosphoric acid esters have often been added. The thus obtained coatings however are either too brittle or show poor gloss and insufficient leveling so that the quality of the thus obtained copper layers no longer meets nowadays' high demands. Therefore, these additives have lost their importance in our day.

The utilization of certain phenazinium compounds and of the derivatives thereof for producing bright copper layers has long been known. These phenazinium compounds, which are described for example in DE 947 656 C1, are used as additives in a bath for the electrolytic production of copper coatings.

These compounds may however also be used in combination with other additives. DE 15 21 062 A1 for example proposes bath compositions for an aqueous, acidic copper bath containing an organic sulfide containing at least one sulfonic acid group as well as, in the mixture or chemically bound, a polyether containing at least three, preferably six, oxygen atoms and being free from aliphatic hydrocarbon chains having more than six C atoms. These baths make it possible to deposit bright and ductile copper layers. The preferred polyethers are 1,3-dioxolane polymerisates having a molecular weight of at least 296, preferably of about 5,000. In combination with the bath additives mentioned, there can also be utilized phenazine dyestuffs such as diethyl-phenosafranine-azo-dimethyl-aniline, dimethyl-phenosafranine-azo-dimethyl-aniline, diethyl-phenosafranine-azo-phenol, and dimethyl-azo-(2-hydroxy-4-ethylamino-5-methyl)-benzene. The phenazine dyestuffs make it possible to obtain high leveling and a bright deposit. However, the copper electrolytes described in DE 15 21 062 A1 do not allow using a high cathodic current density. Moreover, the deposited copper surfaces can only be nickel-plated after having been subjected to a previous intermediate treatment.

DE 20 39 831 C1 further describes a sulfuric acid copper electrolyte that contains, in addition to a polymeric compound containing oxygen and to a thio compound having functional groups for increasing the water solubility, at least one further dyestuff from the group of the polymeric phenazinium compounds. These baths may further contain non-ionic wetting agents and organic sulfur compounds. It has been found though, that these baths only allow depositing irregularly leveled copper coatings. Using this bath to manufacture printed circuit boards leads to the phenomenon which is referred to as a flattened hole rim and that shows a reduced copper layer in the direct proximity to holes in the printed circuit board. As a result, breaks may form in the copper coating at the entrance of the holes during the soldering process. In the case of decorative copper deposits, this disadvantage results in an irregular aspect of the layer on various locations of the workpiece. Therefore, the bath is not suitable for depositing decorative, mirror polished coatings.

A mixture of oligomeric phenazinium compounds as an additive to an acidic bath for the electrolytic deposition of a copper deposit is disclosed in DE 102 61 852 B3. Such type baths already allow obtaining good deposit results. The disadvantage however is that the manufacturing of the phenazinium compounds is very expensive. Another disadvantage is that these phenazinium compounds have very strong colours and stain the electrolyte. As a result, the manipulation thereof is often displeasing and complicated since they permanently stain both the dosing tank and other parts of the line as well as the hands.

The use of reaction products of polyalkanolamines with an alkylating agent or a quaternization agent, such as benzyl chloride (U.S. Pat. No. 4,110,176) and of polyalkylene imines with epichlorohydrin and an alkylating agent (EP 0 068 807 A2) as an additive in copper baths instead of dyestuffs for producing bright and leveled coatings is also described.

There is also described that polyalkylene imines with organic thio compounds may also be utilized as additives in plating baths. DE 1 246 347 B1 for example states that the use of one or a plurality of straight-chained or branched polyalkylene imines or of the functional derivatives thereof with organic thio compounds as a brightener in the production of bright and level copper coatings is advantageous. The functional derivatives more specifically are the salts of the polyalkylene imines and of the reaction products thereof with carbon dioxide, carbonic acid esters, alkyl halides or fatty acids. These substances can be utilized in the bath together with other current brighteners and/or wetting agents. The copper electrolyte described herein however does not allow the use of high current densities as they are currently used for electroplating. Since the additives described are only effective in a narrow range of current density, they hardly find any application in our day.

Further, EP 0 107 109 A2 describes reaction products of thio compounds with acryl amide for copper baths.

DE 27 46 938 A1 discloses a bath containing inter alia as additives acid amides together with an oxygen-containing high molecular compound and with an organic thio compound with functional groups for increasing the water solubility. This bath however only allowed achieving an improved gloss distribution. The leveling and the optical aspect of the copper coatings however could not be improved.

An aqueous, acidic copper bath is further known from U.S. Pat. No. 3,502,551, said bath containing at least one copper salt, at least one inorganic acid, possibly a chloride, and, as additives, a nitrogen-containing aliphatic hydrocarbon compound, an oxygen-containing high molecular compound and an organic thio compound with functional groups for increasing the water solubility. The combined additives are intended to improve the brightness and the leveling of the deposited copper layer.

Further, the utilization of thiourea-formaldehyde condensates as additives to acidic copper plating baths has been described. DE 1 152 863 A for example describes pre-condensates of thiourea-formaldehyde as levelers. The baths described may contain as basic brighteners compounds of the type of the derivatives of dithiocarbamic acid. DE 1 165 962 B describes the use of pre-condensation products of thiourea, formaldehyde and of a compound with at least two amino groups in the molecule in an acidic bath for manufacturing leveling copper coatings. In addition, the bath may contain known basic brighteners.

DE 1 218 247 A indicates an acidic electrolytic copper plating bath for manufacturing mirror-polished, leveled copper coatings that contains compounds that are hardly soluble in water and comprise in the molecule thiocarbonyl groups and aryl or aralkyl radicals in the ratio 1:1, these two groups being separated by heteroatoms that are bound together or that form component parts of a ring system. These are for example products of the aromatic N-monosubstitution of the thiosemicarbazide, and also thiosemicarbazones of aromatic aldehydes, derivatives of the thiocarbohydrazide, heterocyclic compounds with a thiocarbonyl group and thiuram mono- and polysulfides, dixanthogen mono- and polysulfides and hydrazine dithiocarbonamides. These compounds can be used together with derivatives of sulfones and sulfoxides.

A disadvantage of the plating baths mentioned in DE 1 152 863 A, DE 1 165 962 B and DE 1 218 247 A is that, although the additives disclosed allow obtaining bright copper surfaces, these additives only provide poor leveling. In addition to the other drawback consisting in the low solubility of the compounds in water, these additives cannot meet the demands placed on current practice.

Copper electrolytes containing reaction products of epihalogenhydrins with substituted pyridines, organic thio compounds and wetting agents as bath additives are further known from DE 27 06 521 A1. These baths allow improving gloss but not improving the metal distribution.

DE 196 43 091 A1 describes an agent for treating metallic or metallized surfaces, said agent containing water soluble reaction products of water soluble polyamidoamines and/or polyamines with epichlorohydrin, as well as the use of this agent in copper baths, noble metal baths or alloy baths and a method of manufacturing these agents. DE 197 58 121 A1 describes reaction products of dihalogenhydrins and 1-halogen-2,3-propanediol with polyamidoamines that can be added to the copper baths. Although the plating baths described allow achieving well distributing, ductile copper deposits, the coatings show hardly any leveling and are therefore not suitable for decorative purposes or for filling blind vias.

The use of polymeric compounds in copper plating baths containing an amino group or the functional derivatives thereof or a heterocyclic radical bound through a nitrogen atom is known from DE 15 21 031 A. DE 933 843 B also describes the use of polyvinylamine and polyvinylpyrrolidone for acidic copper electrolytes for example. These compounds however only show little leveling effect. Moreover, the current density that can be applied is low or is even reduced through the addition of the compounds described. The polyvinylamine mentioned thereby has an aggressive effect on the deposit which, as a result thereof is brittle in practice with streak-like relief structure becoming visible. Also, the derivatives of polyvinylamine mentioned therein again only exhibit poor brightening and leveling effect.

Beside the prior art drawbacks mentioned herein above, the additives mentioned have proved to degrade the mechanical properties as compared to plating methods in which these additives are not utilized. In particular the hardness and the breaking elongation of the copper coatings may worsen. Likewise, passivation phenomena requiring subsequent activation in order for the electroplating process to be continued occur in the copper layers deposited using these substances. Moreover, it could be found out that many of the substances listed, which act as inhibitors during the copper deposition, degrade metal distribution so that breaks occur in holes and at hole rims on printed circuit boards as a result of the locally reduced thickness of the metal layer. These problems became particularly evident when the deposited layer of copper was subjected to thermal load through the subsequent soldering processes.

Thus, one object of the present invention is to circumvent the disadvantages of the known copper baths and methods during the metallization of workpieces, such as of metal or plastic substrates or printed circuit board material, and more specifically to provide additives allowing for reproducibly manufacturing particularly bright, i.e., mirror-polished, as well as well leveled and ductile copper coatings. Another object of the invention also is to allow for even the smallest holes in the surface of the workpieces such as printed circuit boards to be filled. Yet another object of the invention is to have the additives thereby be synthesizable simply and inexpensively as well as with no change in quality. Yet another object of the invention is to make it possible to produce mirror-polished, leveled and ductile copper layers, using a relatively high current density. Yet another object of the invention is to reduce the electroplating times using, as far as practicable, high mean current densities of for example 4A/dm$^2$ or more. Yet another object of the invention is to also fill microvias much faster. Yet another object of the invention is to have the composition of such type copper plating baths to remain constant over a long period of time.

The solution to the above objects are the polyvinylammonium compound, the method of manufacturing the compound, the aqueous acidic solution for electrolytically depositing a copper deposit as well as the method of electrolytically depositing a copper deposit with a solution containing at least one polyvinylammonium compound. Preferred embodiments of the invention are recited in the dependent claims.

The polyvinylammonium compound of the invention can be made from a corresponding starting polymer that may comprise different or identical monomer units using preferably organic halogenides. The polyvinylammonium compound of the invention can be used advantageously alone or in a mixture with other polyvinylammonium compounds of the invention, in a plating solution for the electrolytic manufacturing of a mirror-polished, leveled copper deposit for use in producing decorative and/or ductile surfaces. The solution can for example be utilized for the decorative copper plating of plastic parts for the sanitary and automotive industry. Further, the polyvinylammonium compounds can also be utilized advantageously in a copper plating solution for electrolytically depositing a copper deposit on printed circuit boards or other circuit carriers, with the copper deposit selectively and completely filling microvias contained in the printed circuit boards or other circuit carriers. Moreover, the polyvinylammonium compounds can also advantageously be utilized in a copper plating solution for electrolytically depositing a copper deposit on surfaces of semiconductor substrates (wafers) provided with trenches during the manufacturing of integrated circuits, more specifically on surfaces with trenches having a high aspect ratio. The copper deposit thereby is uniformly produced on the entire surface of the semiconductor substrate.

The compound of the invention is a polyvinylammonium compound according to the general chemical formula (I):

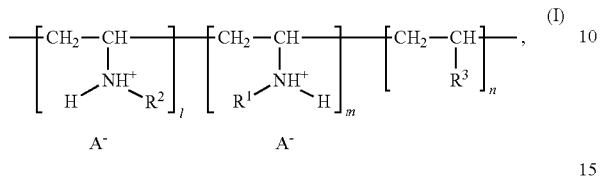

wherein
l, m and n are indices of monomer units and indicate the fraction of the respective monomer unit in the polyvinylammonium compound in [mole %], with l+m+n=100 mole % with the proviso that
1) l+m, relating to l+m+n, is in a range of from 1 to 100 mole % and n, relating to l+m+n, is in a range of from 99 to 0 mole %, and
2) m, relating to l+m, is in a range of from 1 to 100 mole % and l, relating to l+m, is in a range of from 99 to 0 mole %,
$R^1$ is a radical, selected from the group comprising substituted and unsubstituted aralkyl and alkenyl,
$R^2$ is CHO or H, with $R^2$ being the same or different in all the monomer units having index l in the polyvinylammonium compound, with the proviso that the fraction of the H-containing monomer units having index l is within a range of from 1 to 100 mole %, relating to all the monomer units having index l, and that the fraction of the CHO-containing monomer units having index l is within a range of from 99 to 0 mole %,
$R^3$ is a radical selected from the group comprising saturated carboxylic acids having 1 to 6 carbon atoms, unsaturated carboxylic acids having 3 to 8 carbon atoms as well as esters, anhydrides, amides and nitriles of the afore mentioned carboxylic acids, with $R^3$ being the same or different in all the monomer units having index n in the polyvinylammonium compound, and
$A^-$ is an acid anion,
as well as polyvinylammonium compounds of the general chemical formula (I), wherein one of the monomer units having index l and m or both are present in the neutral form.

The polyvinylammonium compound may also comprise monomer units in which the sum of l+m, relating to l+m+n, is in a range of from 1 to 98 mole %, more specifically from 1 to 95 mole %, even more specifically from 1 to 90 mole % and most specifically from 1 to 60 mole %. Accordingly n, relating to l+m+n, is in a range of from 99 to 2 mole %, more specifically from 99 to 5 mole %, even more specifically from 99 to 10 mole % and most specifically from 99 to 40 mole %.

The sequence of the monomer units having indices l, m and n in the polyvinyl-ammonium compound of the invention is discretionary. The polyvinylammonium compound may thereby contain the monomer units in the form of block polymers or of copolymers, with alternating block polymers and copolymers also being possible. The free valences of a monomer unit in the polyvinylammonium compound at the end of a polymer chain may for example be saturated with hydrogen.

The above mentioned equally applies to the starting polymers, relating to the monomer units having indices l and n.

Polyvinylammonium compounds of the invention, wherein one of the monomer units having indices l and m or both are present in the neutral form, thereby have the following general chemical formulae (Ia), (Ib) and (Ic), wherein $R^1$, $R^2$, $R^3$, l, m, n and $A^-$ have the meaning as defined herein above:

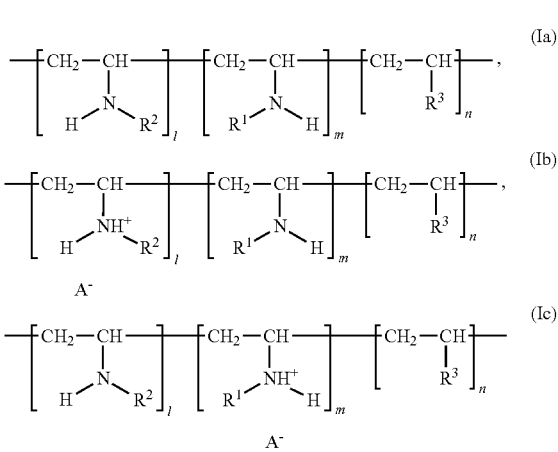

The various forms of the polyvinylammonium compounds of the invention can be transformed into one another by simple methods known to those skilled in the art.

The term polyvinylammonium compound as used herein after not only includes the salt-containing polyvinylammonium compounds having the general chemical formula (I) but also always polyvinylammonium compounds having general chemical formulae (Ia), (Ib) and (Ic), wherein one of the monomer units having indices l and m or both are present in the neutral form.

The fraction of the monomer units having index l in which $R^2$=H, relating to all the monomer units having index l in the polyvinylammonium compound, is obtained by the choice of the educts in the manufacturing method for the starting polymers as well as from the manufacturing method itself. This fraction can also be modified in the method of manufacturing the compounds of the invention, for example through a subsequent hydrolysis of the compounds of the invention.

Depending on the method of manufacturing the starting polymers, various monomer units having index n can be present in the polyvinylammonium compound of the invention beside the monomer units having index m and possibly l, said monomer units accordingly comprising different radicals $R^3$.

It is preferred that aralkyl be benzyl or phenylethyl and alkenyl be vinyl or allyl. Substituted aralkyl and alkenyl can preferably comprise substituents selected from the group comprising lower alkyl, sulfo- or carboxyl alkyl, hydroxy, nitrile, thiocyanate, cyanate, thiol and amino, wherein amino can be $NH_2$, NHR' or NR'R", wherein R' and R" in turn can be lower alkyl.

Used in connection with the present invention, the term lower alkyl preferably refers to alkyl having 1 to 5 carbon atoms, more preferably to methyl, ethyl, n-propyl, isopropyl, n-butyl, isobutyl, or tert-butyl.

The term aralkyl as used herein may refer to heteroaryl or aryl, more specifically to phenyl and naphthyl, which is mono-, di-, tri-, poly-substituted with straight-chained or branched alkyl, more specifically lower alkyl.

The term alkenyl as used herein may refer to lower alkenyl, viz., to alkylen having 2 to 6 carbon atoms, more specifically to ethylen, n-propylen, isopropylen, n-butylen, isobutylen or tert-butylen including the isomers thereof. Preferably, the saturated carboxylic acids present in the polyvinylammonium compound may be ethanoic acid, propionic acid and butyric acid. Preferably, the unsaturated carboxylic acids present may be acrylic acid, methacrylic acid, crotonic acid, vinylacetic acid, maleic acid, fumaric acid and itaconic acid.

The acid anion $A^-$ may preferably be selected from the group comprising the following anions: hydrogen sulfate, halide, pseudohalide, tetrafluoroborate, hexafluorophosphate, nitrate, acetate, trifluoroacetate and methanesulfonate.

Preferably, the polyvinylammonium compounds have a molecular weight $M_w$ in a range of from 500 to 500,000.

Particularly preferred polyvinylammonium compounds are those in which the fraction of the monomer units having index l in which $R^2$=H, relating to all of the monomer units having index l in the polyvinylammonium compound, is in a range of from 90 to 95 mole % and the fraction of the CHO-containing monomer units having index l is in a range of from 5 to 10 mole %, with these polyvinyl-ammonium compounds preferably having a molecular weight in a range of from 500 to 500,000, a molecular weight of from 15,000 to 45,000 being particularly preferred. Further, polyvinylammonium compounds in which n=0 mole % are also preferred.

The polyvinylammonium compound of the invention can be obtained by reacting a) at least one starting polymer of the following general chemical formula (II)

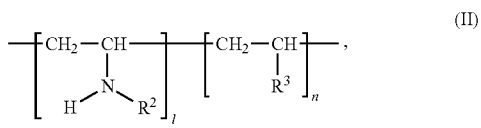

wherein $R^2$, $R^3$, l and n have the same meaning as indicated herein above, with l+n=100 mole %, with the proviso that l is in a range of from 1 to 100 mole % and n is in a range of from 99 to 0 mole %, in one embodiment l, relating to l+n, is in a range of from 1 to 98 mole %, more specifically from 1 to 95 mole %, even more specifically from 1 to 90 mole % and most specifically from 1 to 60 mole %. Accordingly n, relating to l+n, is in a range of from 99 to 2 mole %, more specifically from 99 to 5 mole %, even more specifically from 99 to 10 mole % and most specifically from 99 to 40 mole %.

with b) at least one reagent that introduces an organic radical into the starting polymer, said reagent being selected from the group comprising substituted and unsubstituted alkenylation and aralkylation agents.

The temperature chosen for the reaction preferably ranges from room temperature to the value of the boiling temperature of the reaction mixture. Temperatures ranging from 20 to 100° C. are particularly preferred.

It is preferred that the reaction be conducted in an aqueous, preferably acidic, medium and that the reaction mixture be stirred.

The reagents introducing an organic radical are preferably utilized in a lesser amount, relating to the quantity of monomer units of the starting polymer having the index l present in the polyvinylammonium compound. Preferably, the starting polymer is reacted with 1 to 50 mole % of the at least one reagent, relating to the quantity of the monomer units of the starting polymer having the index l present in the polyvinylammonium compound.

The concentration decrease of the reagent utilized in the reaction can be controlled by sampling and for example by gas chromatography. The reaction ends when there are no free reagents left.

Using the reagents introducing an organic radical into the starting polymer, the radical $R^1$ is introduced into the nitrogen group of the monomer unit having index l in the formula (II) of the starting polymer, forming thereby the monomer units having index m in the polyvinylammonium compound of the invention in accordance with the formula (I) or the neutral or semi-neutral forms thereof. If not all of the monomer units having index l of the starting polymer are reacted, polyvinylammonium compounds of the invention, which at least contain the monomer units having index l and m, are obtained accordingly.

The reagents used comprise substituted or unsubstituted alkenylation and aralkylation agents. Particularly preferred such agents are alkenyl and aralkyl halides, e.g., allyl chloride, allyl bromide, benzyl chloride, benzyl bromide, phenylethyl chloride and phenylethyl bromide. The alkenylation and aralkylation agents may comprise substituents such as lower alkyl and/or sulfo- or carboxyl alkyl, hydroxyl, nitrile, thiocyanate, cyanate, thiol and amino, wherein amino may be $NH_2$, NHR' or NR'R" and wherein R' and R" in turn are lower alkyl.

Preferred starting polymers have a fraction of the monomer units having index l in which $R^2$=H, relating to all the monomer units having index l, in a range of from 90 to 95 mole % and a fraction of the CHO-containing monomer units having index l in a range of from 5 to 10 mole %, said starting polymers preferably comprising a $M_w$ in a range of from 500 to 500,000, a range of from 15,000 to 45,000 being particularly preferred. Polyvinylammonium compounds in which n=0 mole % are preferred.

The polyvinylammonium compounds of the invention preferably are reaction products of the following starting polymers:

i) starting polymers according to the formula (II) with n=0 mole % and at a quantity of the monomer units having index l in which $R^2$=H of 100 mole % (polyvinylamine) or ii) starting polymers according to the formula (II) in the form of copolymers consisting of monomer units having index n with n=1 to 99 mole % and 99 to 1 mole % of monomer units having index l in which $R^2$ solely equals H, or iii) starting polymers according to the formula (II) with n=0 mole % in the form of copolymers consisting of monomer units having index l in which the fraction of the monomer units in which $R^2$=H amounts to 99 to 1 mole % and in which the fraction with $R^2$=CHO is in a range of from 1 to 99 mole % (copolymer consisting of vinylamine monomer units and N-vinylformamide monomer units).

These starting polymers are preferably reacted with 1 to 50 mole % of the at least one reagent introducing an organic radical, relating to the amount of the monomer units having index l of the starting polymer present in the polyvinylammonium compound.

The starting polymers can be produced by polymerisation. EP 0 071 050 A1 for example describes the production of water soluble copolymers consisting of 10 to 90 mole % of vinylamine and 90 to 10 mole % of N-vinylformamide and K values ranging from 10 to 200 for use as flocculating agents for slurries. The production of water soluble copolymers consisting of 10 to 95 mole % of N-vinylformamide and of 90 to 5 mole % of vinylacetate, vinylpropionate, $C_1$- to $C_4$-alkylvinylether, N-vinylpyrrolidone as well as of esters, amides and nitrites of acrylic and methacrylic acid from which at least 30% of the formamide groups are split off under hydrolysis is known from EP 0 216 387 A2 and from U.S. Pat. No. 4,774, 285.

The K value thereby indicates the mean molecular weight of a polymeric substance in the solution and was derived by Fikentscher from the relative viscosity of polymer solutions (Fikentscher, *Cellulosechemie* 13:(1932) 58). The K-value is calculated using the following equation:

$$\log\frac{\eta_c}{\eta_0} = \left(\frac{75 \cdot k^2}{1 + 1.5k \cdot c} + k\right) \cdot c$$

wherein c is the concentration of the polymeric substance in the solution [g/100 ml], $\eta_c$ is the solution viscosity, $\eta_0$ is the viscosity of the solvent and k is a value according to Fikentscher (K=1000·k).

Also, the starting polymers are commercially available. Products of BASF AG such as Lupamin® 1595 (aqueous solution of a copolymer consisting of 95 mole % of vinylamine monomer units and 5 mole % of N-vinylformamide monomer units; $M_w$ 15,000), Lupamin® 9095 (aqueous solution of a copolymer consisting of 95 mole % of vinylamine monomer units and 5 mole % of N-vinylformamide monomer units; $M_w$ 340,000) or Lupamin® 4595 (aqueous solution of a copolymer consisting of 95 mole % of vinylamine monomer units and 5 mole % of N-vinylformamide monomer units; $M_w$ 45,000) may be used for example. The polyvinylammonium compounds of the invention produced from these starting polymers have proved particularly efficient used singly or in combination for the deposition of copper because they exhibit outstanding brilliance at high current densities in the copper electrolyte.

Depending on the deposition solution used, it may be advantageous to exchange the acid anion resulting from the reaction in the polyvinylammonium compounds with other acid anions by salt anion interchange. Thus, after reaction, the polyvinylammonium compounds can be washed and the acid anion exchanged such as by ion exchange chromatography and subsequent appropriate elution. A halide for example may be exchanged with another acid anion selected from the group comprising hydrogen sulfate, pseudohalide, tetrafluoroborate, hexafluorophosphate, nitrate, acetate, trifluoroacetate and methanesulfonate.

The manufacturing method of the invention will be explained by way of the following manufacturing examples:

MANUFACTURING EXAMPLE 1

100 g of Lupamin® 1595 (aqueous solution of a copolymer consisting of 95 mole % of vinylamine monomer units and 5 mole % of N-vinylformamide monomer units; $M_w$ 15,000) were heated to a temperature of 100° C. together with 3.2 g of benzyl chloride (11 mole %, relating to the vinylamine monomer unit) with stirring for 2 hours until the product no longer contained any free benzyl chloride (gas chromatography testing). The reaction was stopped and the product isolated.

MANUFACTURING EXAMPLE 2

100 g of Lupamin® 9095 (aqueous solution of a copolymer consisting of 95 mole % of vinylamine monomer units and 5 mole % of N-vinylformamide monomer units; $M_w$ 340,000) were heated to a temperature of 100° C. together with 3.2 g of benzyl chloride (15 mole %, relating to the vinylamine monomer unit) with stirring for 2 hours until the product no longer contained any free benzyl chloride (gas chromatography testing). The reaction was stopped and the product isolated.

MANUFACTURING EXAMPLE 3

100 g of Lupamin® 4595 (aqueous solution of a copolymer consisting of 95 mole % of vinylamine monomer units and 5 mole % of N-vinylformamide monomer units; $M_w$ 45,000) were heated to a temperature of 100° C. together with 26.5 g of benzyl chloride (10 mole %, relating to the vinylamine monomer unit) with stirring for 2 hours until the product no longer contained any free benzyl chloride (gas chromatography testing). The reaction was stopped and the product isolated.

The solution to another basic object of the invention is an aqueous acidic solution for electroplating copper coatings, said solution containing at least one polyvinylammonium compound of the invention and the corresponding method of electrolytically depositing a copper deposit using said solution. It has been found that the polyvinylammonium compounds are particularly advantageous in copper plating baths since they are characterized by a high galvanic activity. Using the polyvinylammonium compounds of the invention in an acidic electrolytic copper plating solution, it is possible to operate the latter at a high current density. Moreover, in combination with other additives that are known per se, it is possible to obtain uniform, brilliant, mirror-polished copper deposits. Furthermore, the efficiency of the polyvinylammonium compounds is increased by their synthesis in accordance with the invention. As a result, by adding at least one polyvinylammonium compound of the invention to a copper electrolyte, outstanding brilliance and leveling is achieved so that even blind micro vias having a high aspect ratio can be filled.

The polyvinylammonium compounds of the invention can be added, alone or in combination with brighteners or wetting agents, to a copper electrolyte, more specifically to an acidic, preferably to a sulfuric acid solution.

In order to allow deposition of a copper layer onto a workpiece with an electrolytic method, said workpiece is brought into contact with an anode and with the deposition solution. An electric current flow is then generated between the workpiece and the anode for the metal to be deposited.

The basic composition of a copper electrolyte may vary within wide limits. Generally, an acidic, copper containing aqueous solution of the following composition is used: from 20 to 300 g/l, preferably from 180 to 220 g/l, copper sulfate ($CuSO_4 \cdot 5H_2O$), from 50 to 350 g/l, preferably from 50 to 90 g/l, sulfuric acid, conc., from 0.01 to 0.25 g/l, preferably from 0.05 to 0.14 g/l, chloride ions.

At least in parts, other copper salts than copper sulfate can be used. The sulfuric acid also can be replaced in part or in whole by fluoroboric acid, methane sulfonic acid or by other acids. The chloride ions are added as alkali chloride (e.g., sodium chloride) or in the form of hydrochloric acid p.a. The addition of sodium chloride can be eliminated in part or in whole if the additives already contain halide ions.

The polyvinylammonium compound of the invention or mixtures of these polyvinylammonium compounds are preferably added to the solution in a concentration of from 0.0001 to 0.4 g/l, with a concentration of from 0.005 to 0.05 g/l being particularly preferred.

Moreover, the solution may contain current brighteners, levelers or wetting agents. In order to obtain bright copper deposits having predetermined physical properties, at least one water soluble sulfur compound and an oxygen-containing, high molecular weight compound may be added to the acidic solution of the invention. Further additives such as nitrogen-containing sulfur compounds may also be used. The oxygen-containing, high molecular weight compounds are more specifically glycol ethers of alkyl phenols, alkanols and alkanediols, also glycol esters of aliphatic carboxylic acids as well as polyethers and polyalcohols.

These individual components are contained in the ready-for-use solution in the following ranges of concentration: from 0.005 to 20 g/l, preferably from 0.01 to 5 µl, current oxygen-containing high molecular weight compounds, from 0.0005 to 0.4 g/l, preferably from 0.001 to 0.15 g/l, current water soluble organic sulfur compounds.

In Table 1 there are listed some oxygen-containing high molecular weight compounds that may be used.

In Table 2 there are listed some sulfur compounds. Appropriate functional groups are incorporated for water solubility.

Sulfur containing nitrogen compounds, more specifically nitrogen-containing thio compounds, preferably thiourea derivatives, can be used in the following concentrations: from 0.0001 to 0.50 g/l, preferably from 0.0005 to 0.04 g/l. Preferred nitrogen containing thio compounds are listed in Table 3.

The various single components of the basic composition are added to produce the solution. The operating conditions during deposition can more specifically be adjusted as follows: pH: <1, temperature: from 15° C. to 50° C., preferably from 20° C. to 40° C., cathodic current density: from 0.5 to 12 A/dm$^2$, preferably from 3 to 7 A/dm$^2$.

The deposition solution can be agitated by producing a strong flow and at need by injecting clean air so that the surface of the electrolyte is strongly agitated. This maximizes mass transport in the proximity of the electrodes and allows for the highest possible current densities. The movement of the cathodes also improves mass transport at the respective surfaces. The increased convection and electrode movement permits to achieve constant and diffusion-controlled deposition. The movements may be horizontal, vertical and/or be caused by vibration. A combination with air injection is particularly efficient.

Copper can be replenished electrochemically by dissolution of copper anodes in order to keep the copper content constant. Copper containing 0.02 to 0.07 wt. % phosphorus can be used for the anodes. The copper anodes should be contained in a filter bag. The use of inert anodes made from platinum-plated titanium or other coatings are also possible. Plating lines in which the work-pieces are coated while in a vertical or horizontal position are state of the art. At need, filters for separating mechanical and/or chemical residues may be inserted into the electrolyte circuits.

The deposition solution of the invention is perfectly suited to produce a decorative copper deposit. Moreover, it may be utilized to electrolytically fill blind microvias on printed circuit boards. In particular in chip carrier manufacturing, this constitutes a promising technology as it allows achieving increased reliability over through hole copper plating, in particular with narrow circuit traces. In a similar way, the solution of the invention provides a smart way of producing conductive patterns on the surfaces provided with trenches of semiconductor substrates (wafers) during the manufacturing of integrated circuits. In carrying out the copper plating method of the invention, an almost constant layer thickness (planarity) is achieved over the entire surface of the wafer, irrespective of the trenches having a high aspect ratio (1:10) so that such type trenches (blind microvias) are copper filled.

The following method examples are given to provide a better understanding of said method.

METHOD EXAMPLE 1

Comparative Example

In an electrolytic cell with soluble, phosphorus-containing copper anodes, a copper solution having the following composition was utilized:

| | |
|---|---|
| 200 g/l | copper sulfate (CuSO$_4$•5H$_2$O) |
| 60 g/l | sulfuric acid, conc. |
| 0.12 g/l | sodium chloride |

The following brighteners were added:

| | |
|---|---|
| 1.5 g/l | polypropylene glycol (800 Da (Dalton)), |
| 0.006 g/l | 3-mercapto propane-1-sulfonic acid, sodium salt |

At an electrolyte temperature of 25° C. and at a current density of 4 A/dm$^2$, a uniformly bright but not mirror-polished, slightly hazy deposit was obtained on a brushed brass plate.

METHOD EXAMPLE 2

Comparative Example 25 mg/l of polyvinyl pyrrolidone were additionally added to the deposition solution according to Method Example 1. After copper had been deposited under the conditions indicated in Method Example 1, the aspect of the copper layer was slightly improved. In this case, the brass plate was brighter but did not yet exhibit a mirror-polished finish. Moreover, due to the high current densities occurring, the plate showed burns (powdery copper deposit).

METHOD EXAMPLE 3

Example in Accordance with the Invention 25 mg/l of the compound of the invention as manufactured in Manufacturing Example 3 was additionally added to the electrolyte of Method Example 1. After the deposition of copper under the conditions indicated in Method Example 1, the aspect of the copper layer on the brass plate was very good. The deposit was extremely brilliant, with reflective properties. The plate showed no burns. No brush streaks were visible at all. This was indicative of the excellent leveling effect of the copper electrolyte.

In accordance with Method Examples 1 through 3, it could be shown that poor leveling is achieved without the polyvinylammonium compounds of the invention. In a separate comparative example, it could moreover be shown that the use of a possible starting polymer for manufacturing the polyvinylammonium compounds of the invention in accordance with Method Example 2 does not yield the desired result. Only the polyvinylammonium compounds of the invention have a good effect.

METHOD EXAMPLE 4

Comparative Example

For coating a printed circuit board provided with blind microvias, a copper deposition solution having the following composition was placed in an electrolytic cell with soluble phosphorus-containing copper anodes:

| | |
|---|---|
| 120 g/l | copper sulfate ($CuSO_4 \cdot 5H_2O$) |
| 200 g/l | sulfuric acid, conc. |
| 0.05 g/l | sodium chloride |

The following brighteners were added:

| | |
|---|---|
| 0.5 g/l | polypropylene glycol (820 Da), |
| 0.005 g/l | bis(ω-sulfopropyl)disulfide, disodium salt |

At an electrolyte temperature of 25° C. and at a current density of 1 A/dm², a slightly hazy deposit could be obtained on a printed circuit board provided with blind microvias that had been previously reinforced with 16 μm copper and had been exposed during 110 minutes, a blind via of 120 μm wide and 60 μm deep being hardly filled with copper.

METHOD EXAMPLE 5

Example in Accordance with the Invention 30 mg/l of the compound of the invention in accordance with Manufacturing Example 2 was additionally added to the electrolyte of Method Example 5. After deposition of copper under the conditions indicated in Method Example 4, the aspect of the printed circuit board was improved. The blind vias of 120 μm wide and 60 μm deep were completely and selectively copper filled. After copper plating, hardly any trench was visible on the copper surface. The total amount of deposited copper was low.

As compared to the hereto before utilized technique for electrolytically copper plating blind vias, this result constitutes another progress since the filling of the blind vias is substantially improved. Moreover, the surface could be processed further without activation.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

TABLE 1

Oxygen-containing high molecular weight compounds

Carboxymethylcellulose
Nonylphenol polyglycol ether
Octanediol-bis(polyalkylene glycol ether)
Octanol polyalkylene glycol ether
Oleic acid polyglycol ester
Polyethylene glycol-polypropylene glycol (polymerisate block or copolymerisate)

TABLE 1-continued

Oxygen-containing high molecular weight compounds

Polyethylene glycol
Polyethylene glycol dimethyl ether
Polypropylene glycol
Polyvinyl alcohol
β-Naphthol-polyglycol ether
Stearic acid polyglycol ester
Stearyl alcohol polyglycol ether

TABLE 2

Sulfur compounds 3-(Benzothiazolyl-2-thio)-propylsulfonic acid, sodium salt
3-Mercaptopropane-1-sulfonic acid, sodium salt
Ethylene dithio dipropyl sulfonic acid, sodium salt
Bis(p-sulfophenyl)-disulfide, disodium salt
Bis(ω-sulfobutyl)-disulfide, disodium salt
Bis(ω-sulfohydroxypropyl)-disulfide, disodium salt
Bis(ω-sulfopropyl)-disulfide, disodium salt
Bis(ω-sulfopropyl)-sulfide, disodium salt
Methyl-(ω-sulfopropyl)-disulfide, disodium salt
Methyl-(ω-sulfopropyl)-trisulfide, disodium salt
O-ethyl-dithio carbonic acid-S-(ω-sulfopropyl)-ester, potassium salt
Thioglycolic acid
Thiophosphoric acid-O-ethyl-bis(ω-sulfopropyl)-ester, disodium salt
Thiophosphoric acid-tris-(ω-sulfopropyl)-ester, trisodium salt

TABLE 3

Nitrogen-containing thio compounds:

N-Acetyl thiourea
N-Trifluoroacetyl thiourea
N-Ethyl thiourea
N-Cyanoacetyl thiourea
N-Allyl thiourea
o-Tolylthiourea
N,N'-Butylene thiourea
Thiazolidine-2-thiol
2-Mercapto-4-thiazoline
2-Imidazolidine thiol
4-Methyl-2-pyrimidine thiol
2-Thiouracil

The invention claimed is:

1. An aqueous acidic solution for electrolytically depositing copper coatings said acidic solution containing copper ions, characterized in that said solution contains at least one polyvinylammonium compound selected from the group comprising compounds having general chemical formula (I):

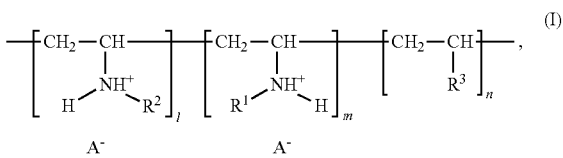

wherein
l, m and n are indices of monomer units indicating the fraction, to be expressed in [mole %], of the respective monomer units in the polyvinylammonium compound, wherein l+m+n in the compound is 100 mole % with the proviso that
1) l+m is in a range of from 1 to 100 mole %, relating to l+m+n, and n is in a range of from 99 to 0 mole %, relating to l+m+n, and 2) m is in a range of from 1 to 100 mole %, relating to l+m, and l is in a range of from 99 to 0 mole %, relating to l+m, $R^1$ is a radical, selected from the group comprising substituted and unsubstituted aralkyl and alkenyl, $R^2$ is CHO or H, with $R^2$ being the same or different in all the monomer units having index l in the polyvinylammonium compound, with the proviso that the fraction of the H-containing monomer units having index l is within a range of from 1 to 100 mole %, relating to all the monomer units having index l, and that the fraction of the CHO-containing monomer units having index l is within a range of from 99 to 0 mole %, relating to all the monomer units having index l, $R^3$ is a radical selected from the group comprising saturated carboxylic acids having 1 to 6 carbon atoms, unsaturated carboxylic acids having 3 to 8 carbon atoms as well as esters, anhydrides, amides and nitriles of the said carboxylic acids, with $R^3$ being the same or different in all the monomer units having index n in the polyvinylammonium compound, and $A^-$ is an acid anion, as well as compounds having general chemical formula (I), wherein one of the monomer units having index l or m or both are present in the neutral form.

2. The aqueous acidic solution according to claim 1, characterized in that aralkyl is benzyl or phenylethyl.

3. The aqueous acidic solution according to any one of the preceding claims 1-2, characterized in that alkenyl is vinyl or allyl.

4. The aqueous acidic solution according to any one of the preceding claims 1-2, characterized in that the saturated carboxylic acids are selected from the group comprising ethanoic acid, propionic acid and butyric acid.

5. The aqueous acidic solution according to any one of the preceding claims 1-2, characterized in that the unsaturated carboxylic acids are selected from the group comprising acrylic acid, methacrylic acid, crotonic acid, vinylacetic acid, maleic acid, fumaric acid and itaconic acid.

6. The aqueous acidic solution according to any one of the preceding claims 1-2, characterized in that the at least one polyvinylammonium compound is contained in a concentration in a range of from 0.0001 to 4 g/l.

7. The aqueous acidic solution according to any one of the preceding claims 1-2, characterized in that the acidic solution additionally contains compounds selected from the group comprising nitrogen-containing sulfur compounds and polymeric nitrogen compounds.

8. The aqueous acidic solution according to claim 7, characterized in that the acidic solution contains the nitrogen-containing sulfur compounds and the polymeric nitrogen-containing compounds in an overall concentration in a range of from 0.0001 to 0.50 g/l.

9. A method for electrolytically depositing a copper deposit, comprising bringing a workpiece and an anode into contact with a copper ions containing acidic solution and generating an electric current flow between the workpiece and the anode, characterized in that the solution contains at least one polyvinylammonium compound selected from the group comprising compounds having general chemical formula (I):

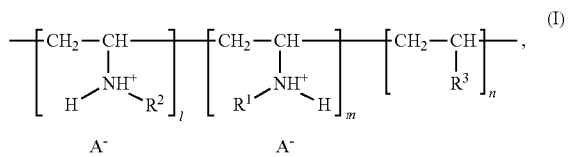

wherein l, m and n are indices of monomer units indicating the fraction, to be expressed in [mole %], of the respective monomer units in the polyvinylammonium compound, wherein l+m+n in the compound is 100 mole % with the proviso that 1) l+m is in a range of from 1 to 100 mole %, relating to l+m+n, and n is in a range of from 99 to 0 mole %, relating to l+m+n, and 2) m is in a range of from 1 to 100 mole %, relating to l+m, and l is in a range of from 99 to 0 mole %, relating to l+m, $R^1$ is a radical, selected from the group comprising substituted and unsubstituted aralkyl and alkenyl, $R^2$ is CHO or H, with $R^2$ being the same or different in all the monomer units having index l in the polyvinylammonium compound, with the proviso that the fraction of the H-containing monomer units having index l is within a range of from 1 to 100 mole %, relating to all the monomer units having index l, and that the fraction of the CHO-containing monomer units having index l is within a range of from 99 to 0 mole %, relating to all the monomer units having index l, $R^3$ is a radical selected from the group comprising saturated carboxylic acids having 1 to 6 carbon atoms, unsaturated carboxylic acids having 3 to 8 carbon atoms as well as esters, anhydrides, amides and nitriles of the said carboxylic acids, with $R^3$ being the same or different in all the monomer units having index n in the polyvinylammonium compound, and $A^-$ is an acid anion, as well as compounds having general chemical formula (I), wherein one of the monomer units having index l or m or both are present in the neutral form.

10. The method according to claim 9 for depositing a mirror-polished, leveled copper deposit for the purpose of producing decorative surfaces.

11. The method according to claim 9 for producing a copper deposit on printed circuit boards provided with blind microvias.

12. The method according to claim 9 for producing a copper deposit on semiconductor substrates.

* * * * *

UNITED STATES PATENT AND TRADEMARK OFFICE
CERTIFICATE OF CORRECTION

| | |
|---|---|
| PATENT NO. | : 8,114,263 B2 |
| APPLICATION NO. | : 11/816717 |
| DATED | : February 14, 2012 |
| INVENTOR(S) | : Wolfgang Dahms et al. |

It is certified that error appears in the above-identified patent and that said Letters Patent is hereby corrected as shown below:

Title Page, Item [57] ABSTRACT

Line 6 reads  "deposit using said aqueous acidic solution, said polyinylam-"
Should read  -- deposit using said aqueous acid solution, said polyvinylam- --

Column 11, line 14, reads "from 0.005 to 20 g/l, preferably from 0.01 to 5ul, current"
should read -- from 0.005 to 20 g/l, preferably from 0.01 to 5 g/l, current --

Column 15, line 56, claim 9, reads "contact with a copper ions containing acidic solution and"
should read -- contact with a copper ion containing acidic solution and --

Signed and Sealed this
Fourteenth Day of August, 2012

David J. Kappos
*Director of the United States Patent and Trademark Office*